US006593820B2

(12) United States Patent
Eatock

(10) Patent No.: US 6,593,820 B2
(45) Date of Patent: Jul. 15, 2003

(54) HIGH FREQUENCY VOLTAGE CONTROLLED OSCILLATOR

(75) Inventor: Frederick L. Eatock, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 82 days.

(21) Appl. No.: 09/927,800

(22) Filed: Aug. 10, 2001

(65) Prior Publication Data
US 2003/0030498 A1 Feb. 13, 2003

(51) Int. Cl.⁷ .............................................. H03B 27/00
(52) U.S. Cl. ........................ 331/57; 331/14; 331/172; 331/34; 327/280; 327/287
(58) Field of Search ............................ 331/57, 34, 45, 331/173, 158, 179, 50, 74, 48, 177 R, 108 B, 60, 38

(56) References Cited
U.S. PATENT DOCUMENTS 5,180,994 A * 1/1993 Martin et al. .................. 331/57
5,239,274 A * 8/1993 Chi ............................... 331/57
5,257,294 A * 10/1993 Pinto et al. .................... 331/57
5,623,234 A * 4/1997 Shaik et al. ................... 331/49
5,872,488 A    2/1999 Lai ............................... 331/57
5,936,476 A    8/1999 Iravani ......................... 331/57
6,016,081 A * 1/2000 O'Shaughnessy ............ 331/54
6,037,842 A * 3/2000 Bryan et al. .................. 331/57
6,100,769 A    8/2000 An et al. ....................... 331/57
6,163,224 A * 12/2000 Araki et al. ................... 331/57
6,496,078 B1 * 12/2002 Wang et al. ................... 331/57

* cited by examiner

Primary Examiner—Michael Tokar
Assistant Examiner—Lam T. Mai

(57) ABSTRACT

A voltage controlled oscillator (VCO) and method for generating voltage controlled oscillating signals utilizes a plurality of timing blocks that form a circular signal path to provide delays to control the frequencies of the signals. The VCO is suitable for applications at frequencies of 3 GHz and higher, and has low voltage and power requirements. The delays provided by the timing blocks are determined by the operating properties of differential transistors, timing capacitors and current sources, which are included in the timing blocks.

26 Claims, 8 Drawing Sheets

HIGH FREQUENCY VOLTAGE CONTROLLED OSCILLATOR

FIELD OF THE INVENTION

The invention relates generally to voltage controlled oscillators, and more particularly to voltage controlled oscillators suitable for applications at frequencies of 3 GHz and higher.

BACKGROUND OF THE INVENTION

A voltage controlled oscillator (VCO) is a critical component in almost every digital communications systems. VCOs generate an oscillating signal at a frequency determined by an external voltage, which is useful for tracking and matching signal frequencies. In a digital communication system, VCOs are used for clock generation and synchronization to transmit and receive data.

As is well known in the field of circuit design, there are various types of VCOs. The particular type of VCOs of interest herein is the type of VCOs that utilize ring oscillators. A ring oscillator includes a number of inverters or differential delay cells that are connected in series. The output of the last differential delay cell is typically connected to the first differential delay cell and consequently, the differential delay cells of the oscillator form a circular path. The frequency at which the VCO oscillates is primarily determined by the delays caused by the differential delay cells included in the ring oscillator.

A conventional VCO of interest is described in U.S. Pat. No. 5,936,476 to Iravani. In one embodiment, the VCO of Iravani includes an amplifier, a replica circuit and a number of VCO cells. Each VCO cell includes a pair of differential transistors that are connected to a common current source. The differential transistors are both connected to a supply voltage (VDD) via a source follower transistor. The replica circuit includes a single "differential" transistor that is connected to a current source and to VDD via a source follower transistor. The replica circuit is designed to match the current and voltage characteristics of the VCO cells. A negative feedback loop connects the replica circuit to the amplifier of the VCO. The amplifier is configured to receive an external voltage and the negative feedback voltage from the replica circuit. The output of the amplifier is connected to the gates of the source follower transistors that are connected to the replica circuit and the VCO cells. The amplifier operates to control each of the source follower transistors in the same manner, and thus, each of the VCO cells compensates for any perturbation in VDD. The VCO of Iravani is described as having an operating frequency of 3 GHz and higher.

Another VCO of interest is described in U.S. Pat. No. 6,037,842 to Bryan et al. The VCO of Bryan et al. includes a differential control voltage, a plurality of variable delay elements, a buffer circuit and a differential driver circuit. The variable delay elements are connected in a ring oscillator configuration. Each variable delay element includes a pair of parallel connected differential CMOS sections, which are controlled by a differential control voltage. The differential control voltage magnitude sets the relative level of operation for the variable delay element, which determines the delay through that variable delay element. The VCO of Bryan et al. is described as having an operating frequency in the GHz range.

Although the above-described VCOs and other known VCOs operate well for their intended purposes, there is a growing interest to develop a VCO suitable for applications at frequencies of 3 GHz and higher that has lower voltage and power requirements, as well as fewer electrical components. In view of this interest, what is needed is a VCO circuit suitable for applications at frequencies of 3 GHz and higher that includes a small number of electrical components and requires low operating voltage and power.

SUMMARY OF THE INVENTION

A voltage controlled oscillator (VCO) and method for generating voltage controlled oscillating signals utilizes a plurality of timing blocks that form a circular signal path to provide delays to control the frequencies of the signals. The VCO is suitable for applications at frequencies of 3 GHz and higher, and has low voltage and power requirements. The delays provided by the timing blocks are determined by the operating properties of differential transistors, timing capacitors and current sources, which are included in the timing blocks.

A VCO in accordance with the present invention includes a number of timing blocks that are connected in a circular signal path configuration. Each timing block includes a differential voltage gain circuit that is configured to output amplified differential signals in response to input differential signals, and a frequency control circuit that is coupled to the differential voltage gain circuit. The frequency control circuit includes a first transistor and a first current source on a first current path, and a second transistor and a second current source on a second current path. The first current path has a first output terminal, which is connected to a first capacitor. Similarly, the second current path has a second output terminal, which is connected to a second capacitor. The first and second transistors are controlled by the amplified differential signals, while the first and second current sources are controlled by an input voltage to source defined amounts of current. The defined amounts of current at least partially define frequencies of output differential signals on the first and second output terminals.

In an exemplary embodiment, the VCO includes a first timing block and a second timing block. Each of the first and second timing blocks includes input terminals and output terminals. The first and second timing blocks are configured such that the output terminals of the first timing block are connected to the input terminals of the second timing block, and the output terminals of the second timing block are connected to the input terminals of the first timing block. In an embodiment, the input terminals and the output terminals of the first and second timing blocks are connected such that output differential signals from the first timing block are inversely received by the second timing block.

In one embodiment, the first and second transistors of the frequency control circuit are bipolar transistors. In another embodiment, the first and second transistors of the frequency control circuit are metal oxide semiconductor transistors. In either embodiment, each of the first and current sources of the frequency control circuit may include a signal metal oxide semiconductor transistor.

The differential voltage gain circuit of each timing block may include one or more differential amplifiers. Each differential amplifier includes differential transistors that are connected to a common current source. In an embodiment, each differential transistor is connected to a resistor, which is connected to a supply voltage.

A method for generating voltage controlled oscillating signals in accordance with the invention includes the steps of receiving first differential signals, amplifying the first differential signals to generate amplified first differential signals, applying the amplified second differential signals to parallel transistors, controlling amounts of current sourced by current sources that are connected to the parallel transistors using an input voltage, and outputting second differential signals having predefined frequencies on output terminals that are connected to the parallel transistors. The output terminals are also connected to capacitors. The predefined frequencies of the second differential signals are at least partially determined by the amounts of current sourced by the current sources and the capacitances of the capacitors. In an embodiment, the first differential signals and the second differential signals have a quadrature phase relationship.

The method may further include the steps of receiving the second differential signals, amplifying the second differential signals to generate amplified second differential signals, applying the amplified second differential signals to second parallel transistors, controlling amounts of current sourced by second current sources that are connected to the second parallel transistors using the input voltage, and outputting the first differential signals having the predefined frequencies on second output terminals that are connected to the second parallel transistors. The second output terminals are connected to second capacitors.

In an embodiment, the step of controlling the amounts of current sourced by the current sources includes supplying the input voltage to parallel current control transistors that function as the current sources. Furthermore, the step of amplifying the first differential signals may include amplifying the first differential signals in two stages using multiple differential amplifiers.

In an embodiment, the parallel transistors are bipolar transistors. In another embodiment, the parallel transistors are metal oxide semiconductors.

Other aspects and advantages of the present invention will become apparent from the following detailed description, taken in conjunction with the accompanying drawings, illustrated by way of example of the principles of the invention.

DETAILED DESCRIPTION

Figure 1:
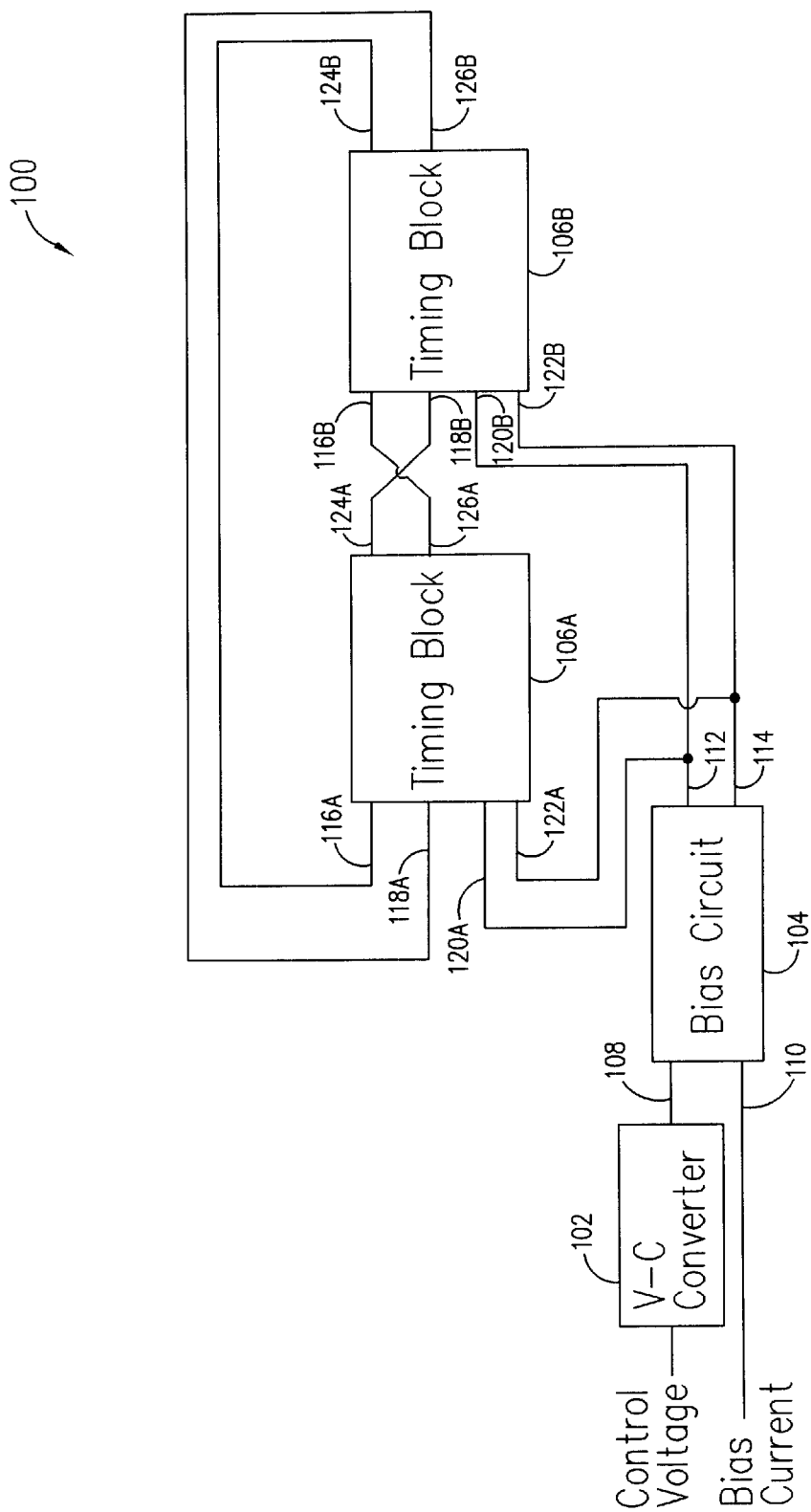
FIG. 1 is a block diagram of a voltage controlled oscillator in accordance with the present invention.

With reference to FIG. 1, a voltage controlled oscillator (VCO) 100 in accordance with the present invention is shown. The VCO is suitable for applications at frequencies of 3 GHz and higher, and can operate at very low supply voltages. Furthermore, the VCO is designed to consume significantly less power than other conventional VCOs with comparable operating frequencies.

The VCO 100 generates differential signals having a frequency that is determined by a control voltage. As illustrated in FIG. 1, the VCO includes a voltage-to-current (V-C) converter 102, a bias circuit 104 and timing blocks 106A and 106B. The V-C converter operates to receive the control voltage and to convert the control voltage into a control current, which is used to control the frequency of the differential signals generated by the VCO. The V-C converter can be any conventional voltage-to-current converter. Since the V-C converter is a known device, the V-C converter is not described in detail herein. The bias circuit 104 of the VCO includes inputs 108 and 110 and outputs 112 and 114. The V-C converter is connected to the input 108 of the bias circuit 104. Thus, the bias circuit receives the control current from the V-C converter. The control current is used to control the delays caused by the timing blocks 106A and 106B, and consequently, to control the frequency of the VCO. The manner in which the control current is used to control the frequency of the VCO is described in detail below. The input 110 of the bias circuit 104 receives a fixed bias current, which is used to generate a fixed bias voltage. The fixed bias voltage is routed to the timing blocks from the output 114 of the bias circuit. The use of the fixed bias current is also described below.

Figure 2:
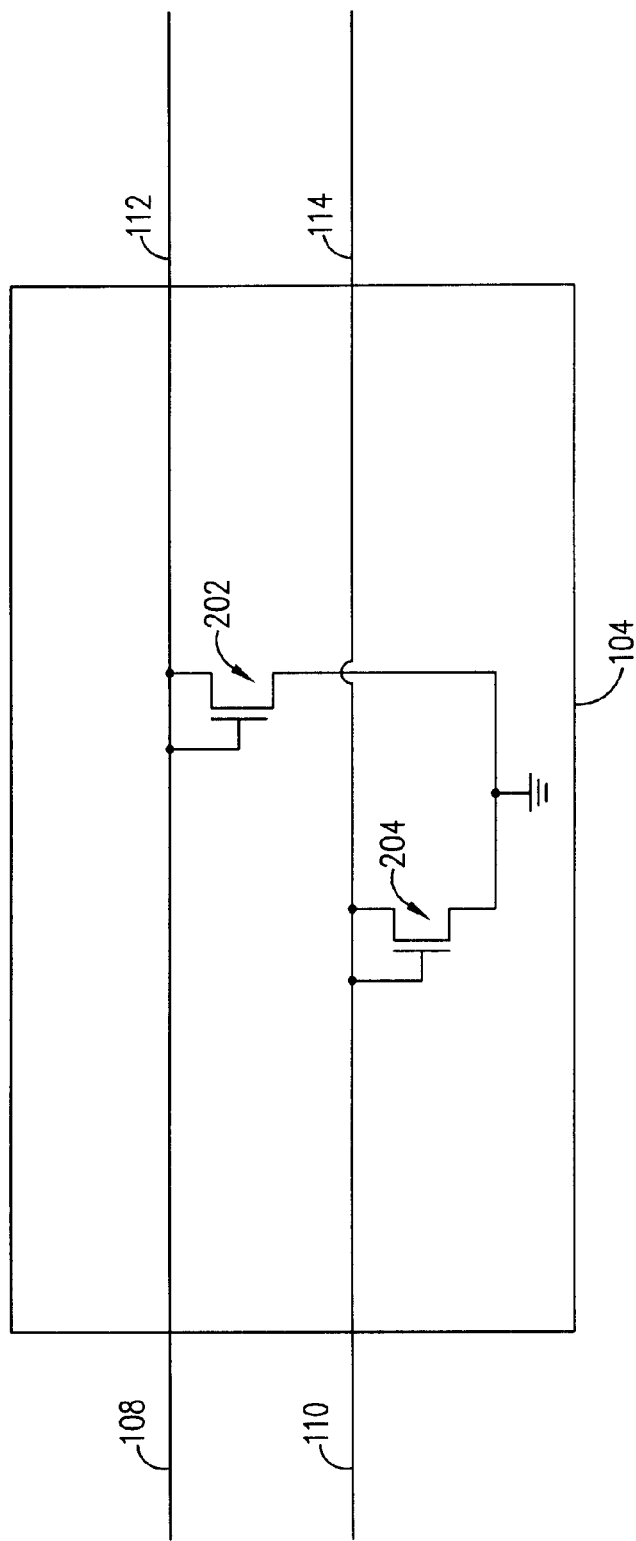
FIG. 2 is a circuit diagram of a bias circuit of the voltage controlled oscillator.

In FIG. 2, a circuit diagram of the bias circuit 104 of the VCO 100 is shown. The bias circuit includes bias metal oxide semiconductor (MOS) transistors 202 and 204. The drain of the bias MOS transistor 202 is connected to the input 108 and the output 112 of the bias circuit, while the source of the transistor 202 is connected to ground (GND). Similarly, the drain of the bias MOS transistor 204 is connected to the input 110 and the output 114 of the bias circuit, while the source of the transistor 204 is connected to GND. The gates of the bias MOS transistors 202 and 204 are connected to their respective drains. Thus, in operation, the control current is routed from the input 108 to the transistor 202, where the transistor 202 generates a variable control bias voltage, which is fed to the output 112 of the bias circuit. Similarly, an equivalent fixed bias voltage for the fixed bias current is delivered to the output 114. The variable control bias voltage on the output 112 is used to mirror the control current from the V-C converter 102 in the timing blocks 106A and 106B. Similarly, the fixed bias voltage on the output 114 is used to mirror the fixed bias current in the timing blocks.

Turning back to FIG. 1, the timing blocks 106A and 106B of the VCO 100 are identical components. Each timing block includes four inputs and two outputs. The timing block 106A includes inputs 116A, 118A, 120A and 122A and outputs 124A and 126A. The timing block 106B includes inputs 116B, 118B, 120B and 122B and outputs 124B and 126B. The inputs 120A and 120B of the timing blocks 106A and 106B are connected to the output 112 of the bias circuit 104 to receive the variable control bias voltage. The inputs 122A and 122B of the timing blocks 106A are connected to the output 114 of the output bias circuit 104 to receive the fixed bias voltage. The input 116A of the timing block 106A is connected to the output 124B of the timing block 106B, while the input 118A of the timing block 106A is connected to the output 126B of the timing block 106B. In contrast, the input 116B of the timing block 106B is connected to the output 126A of the timing block 106A, while the input 118B of the timing block 106B is connected to the output 124A of the timing block 106A. Thus, the outputs 124A and 126A of the timing block 106A are cross-wired to the inputs 116B and 118B of the timing block 106B, as compared to the connections of the outputs 124B and 126B of the timing block 106B to the inputs 116A and 118A of the timing block 106A. Consequently, each timing block receives input signals from the other timing block and transmits output signals to the other timing block. However, the output signals from the timing block 106A, which are received by the timing block 106B, are inverted due to the cross-wiring of the outputs 124A and 126A of the timing block 106A to the inputs 116B and 118B of the timing block 106B.

Figure 3:
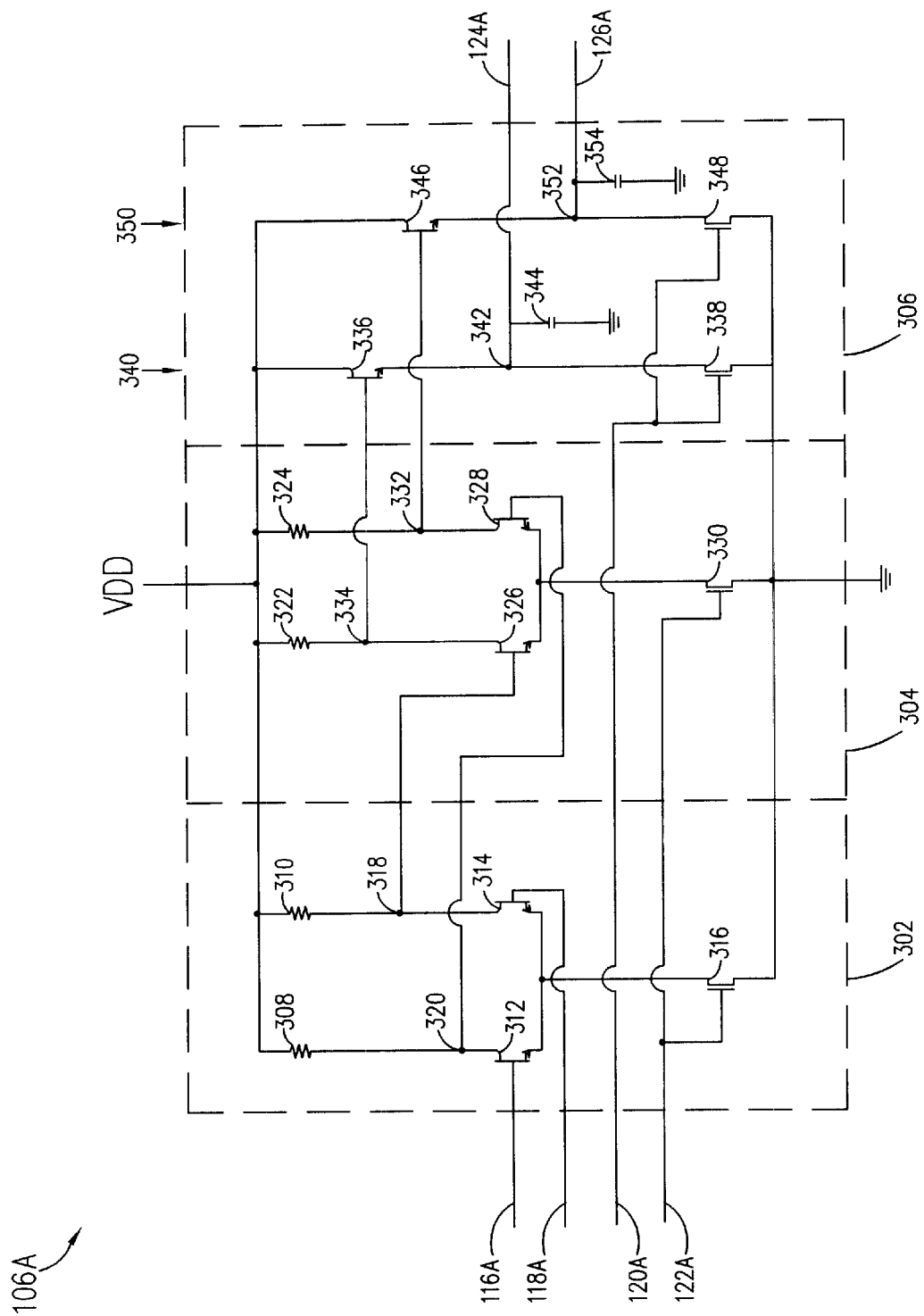
FIG. 3 is a circuit diagram of a timing block of the voltage controlled oscillator.

Turning to FIG. 3, a circuit diagram of the timing block 106A is shown. Since the timing blocks 106A and 106B are identical, only the timing block 106A is illustrated and described in detail. As shown in FIG. 3, the timing block 106A includes differential amplifiers 302 and 304, and a frequency control circuit 306. The differential amplifier 302 comprises resistors 308 and 310 and bipolar differential transistors 312 and 314 that are connected as emitter coupled differential bipolar amplifier pair. The resistor 308 is connected to supply voltage (VDD) and the collector of the differential transistor 312. Similarly, the resistor 310 is connected to VDD and the collector of the differential transistor 314. The emitters of the differential transistors 312 and 314 are connected to a MOS transistor 316, which functions as a current source. The base of the differential transistor 312 is connected to the input 116A, while the base of the differential transistor 314 is connected to the input 118A. Consequently, the differential transistors 312 and 314 are controlled by the input differential signals on the inputs 116A and 118A. The current source transistor 316 of the differential amplifier 302 connects between the differential transistors 312 and 314, and GND. The drain of the current source transistor is connected to the emitters of the differential transistors, while the source of the current source transistor is connected to GND. The gate of the current source transistor is connected to the input 122A. Thus, the current source transistor is controlled by the fixed bias voltage at the input 122A. The current source transistor has the same geometry as the bias MOS transistor 204 of the bias circuit 104 shown in FIG. 2.

The differential amplifier 302 of the timing block 106A also includes output nodes 318 and 320. The output node 320 is located between the resistor 308 and the differential transistor 312, while the output node 318 is located between the resistor 310 and the differential transistor 314. Consequently, the voltages on the output nodes 318 and 320 are dependent on the differential signals applied to the bases of the differential transistors 312 and 314.

The differential amplifier 304 of the timing block 106A includes resistors 322 and 324, differential bipolar transistors 326 and 328, and a current source MOS transistor 330, which are connected between VDD and GND in the same configuration as the differential amplifier 302. However, the bases of the differential amplifiers 326 and 328 are connected to the output nodes 318 and 320 of the differential amplifier 302, respectively. Thus, the differential transistors 326 and 328 are controlled by the voltages on the output nodes 318 and 320 of the differential amplifier 302. Similar to the differential amplifier 302, the differential amplifier 304 also includes output nodes 332 and 334. The output node 332 is located between the resistor 324 and the differential transistor 328, while the output node 334 is located between the resistor 322 and the differential transistor 326. Consequently, the voltages on the output nodes 332 and 334 are dependent on the differential signals applied to the bases of the differential transistors 326 and 328. Similar to the current source transistor 316 of the differential amplifier 302, the gate of the current source transistor 330 is connected to the input 122A. Thus, the current source transistor 330 is also controlled by the fixed bias voltage at the input 122A. The current source transistor 330 has the same geometry as the bias MOS transistor 204 of the bias circuit 104 shown in FIG. 2 and the current source transistor 316 of the differential amplifier 302. As described in more detail below, the bias MOS transistor 204 of the bias circuit 104 and the current source transistors 316 and 330 of the differential amplifiers 302 and 304 function as a current mirror to force drain currents in the current source transistors 316 and 330 to be equal to the input fixed bias current.

The frequency control circuit 306 of the timing block 106A includes an emitter follower transistor 336 and a current source MOS transistor 338 that are connected in series between VDD and GND on a current path 340. The collector of the bipolar transistor 336 is connected to VDD, while the emitter of the transistor is connected to the drain of the current source transistor 338. The base of the bipolar transistor 336 is connected to the output node 334 of the differential amplifier 304. Thus, the emitter follower transistor 336 is controlled by the voltage on the output node 334 of the differential amplifier 304. The gate of the current source transistor 338 is connected to the input 120A, which receives the bias control voltage from the bias circuit 104. Thus, the current source transistor 338 is controlled by the variable bias control voltage. The current source transistor 338 has the same geometry as the bias MOS transistor 202 of the bias circuit 104 shown in FIG. 2. The current path 340 includes a final output node 342 that is connected to the output 124A of the timing block 106A. The final output node 342 is further connected to a timing capacitor 344, which is connected to GND.

The frequency control circuit 306 of the timing block 106A further includes an emitter follower transistor 346 and a current source MOS transistor 348 that are connected in series between VDD and GND on a current path 350. The collector of the bipolar transistor 346 is connected to VDD, while the emitter of the transistor is connected to the drain of the current source transistor 348. The base of the emitter follower transistor 346 is connected to the output node 332 of the differential amplifier 304. Thus, the emitter follower transistor 346 is controlled by the voltage on the output node 332 of the differential amplifier 304. The gate of the current source transistor 348 is connected to the input 120A. Thus, similar to the current source transistor 338 on the current path 340, the current source transistor 348 is also controlled by the variable bias control voltage on the input 120A. The current source transistor 348 has the same geometry as the bias MOS transistor 202 of the bias circuit 104 shown in FIG. 2 and the current source transistor 338 of the frequency control circuit 306. The current path 350 also includes a final output node 352 that is connected to the output 126A of the timing block 106A. The final output node 352 is further connected to a timing capacitor 354, which is connected to GND.

As described in more detail below, the bias MOS transistor 202 of the bias circuit 104 shown in FIG. 2 and the current source transistors 338 and 348 of the frequency control circuit 306 function as a current mirror to force drain currents in the current source transistors 338 and 348 to be equal to the variable control current from the V-C converter 102 of the VCO 100.

In operation, the fixed bias current is fed to the bias MOS transistor 204 of the bias circuit 104, which causes a fixed bias voltage equal to the $V_{ds}$ of the bias MOS transistor 204 at the output 114 of the bias circuit. The fixed bias voltage from the output 114 of the bias circuit 104 is delivered to the gates of the current source MOS transistors 316 and 330 of the differential amplifiers 302 and 304 through the input 122A of the timing block 106A. Since the current source MOS transistors 316 and 330 have the same geometry as the bias MOS transistor 204 of the bias circuit 104, the $V_{ds}$ bias voltage of the bias MOS transistor 204 forces drain current in the current source transistors 316 and 330 to be equal to the input fixed bias current. Thus, the currents in the current source transistors 316 and 330 are dependent on the size of those current source transistors and the applied fixed bias voltage.

In addition to the fixed bias current, the control voltage is first converted into a control current by the V-C converter 102 and fed to the bias MOS transistor 202 of the bias circuit 104. Similar to the fixed bias current, the control current on the bias MOS transistor 202 causes a control bias voltage equal to the $V_{ds}$ of the bias MOS transistors 202 at the output 112 of the bias circuit 104. The control bias voltage is applied to the gates of the current source MOS transistors 338 and 348 of the frequency control circuit 306 through the input 120A of the timing block 106A. Since the current source MOS transistors 338 and 348 have the same geometry as the bias MOS transistor 202 of the bias circuit 104, the $V_{ds}$ bias voltage of the bias MOS transistor 202 forces drain current in the current source transistors 338 and 348 to be equal to the control current from the V-C converter 102. Thus, the currents in the current source transistors 338 and 348 are also dependent on the size of those current source transistors and the applied control bias voltage.

At the differential amplifier 302 of the timing block 106A, differential signals from the other timing block 106B are applied to the bases of the differential transistors 312 and 314. The rise and fall of the input differential signals on the bases of the differential transistors 312 and 314 activate and deactivate the differential transistors 312 and 314, which generate first amplified differential signals on the output nodes 318 and 320. The first amplified differential signals are then received by the differential amplifier 304 at the bases of the differential transistors 326 and 328. The first amplified differential signals on the bases of the differential transistors 326 and 328 generate second amplified differential signals on the output nodes 332 and 334 of the differential amplifier 304. Thus, the differential amplifiers 302 and 304 provide two stages of differential voltage gain.

The second amplified differential signals are then received by the frequency control circuit 306 of the timing block 106A at the bases of the emitter follower transistors 336 and 346. The frequency control circuit 306 of the timing block 106A provides delay, which partially defines the frequency of the VCO 100. The delay provide by the frequency control circuit of the other timing block 106B also partially defines the frequency of the VCO. Thus, the delays provided by both of the timing blocks 106A and 106B, along with the shorter delays of the differential amplifier stages, determine the frequency of the VCO. The current path 340 of the frequency control circuit 306 provides delay for the second amplified differential signal from the output node 334 of the differential amplifier 304, while the current path 350 of the frequency control circuit 306 provides delay for the second amplified differential signal from the output node 332 of the differential amplifier 304.

For the second amplified differential signal from the output node 334 of the differential amplifier 304, the delay is determined by the pull-down cutoff of the emitter follower transistor 336 and the falling voltage "slew-rate" at the associated output node 342. The falling voltage slew-rate is determined by the capacitance of the timing capacitor 344 and the pull-down current of the current source MOS transistor 338. As a result, a delayed signal of the second amplified differential signal from the output node 334 of the differential amplifier 304 is generated at the output 124A of the timing block 106A.

Figure 4:
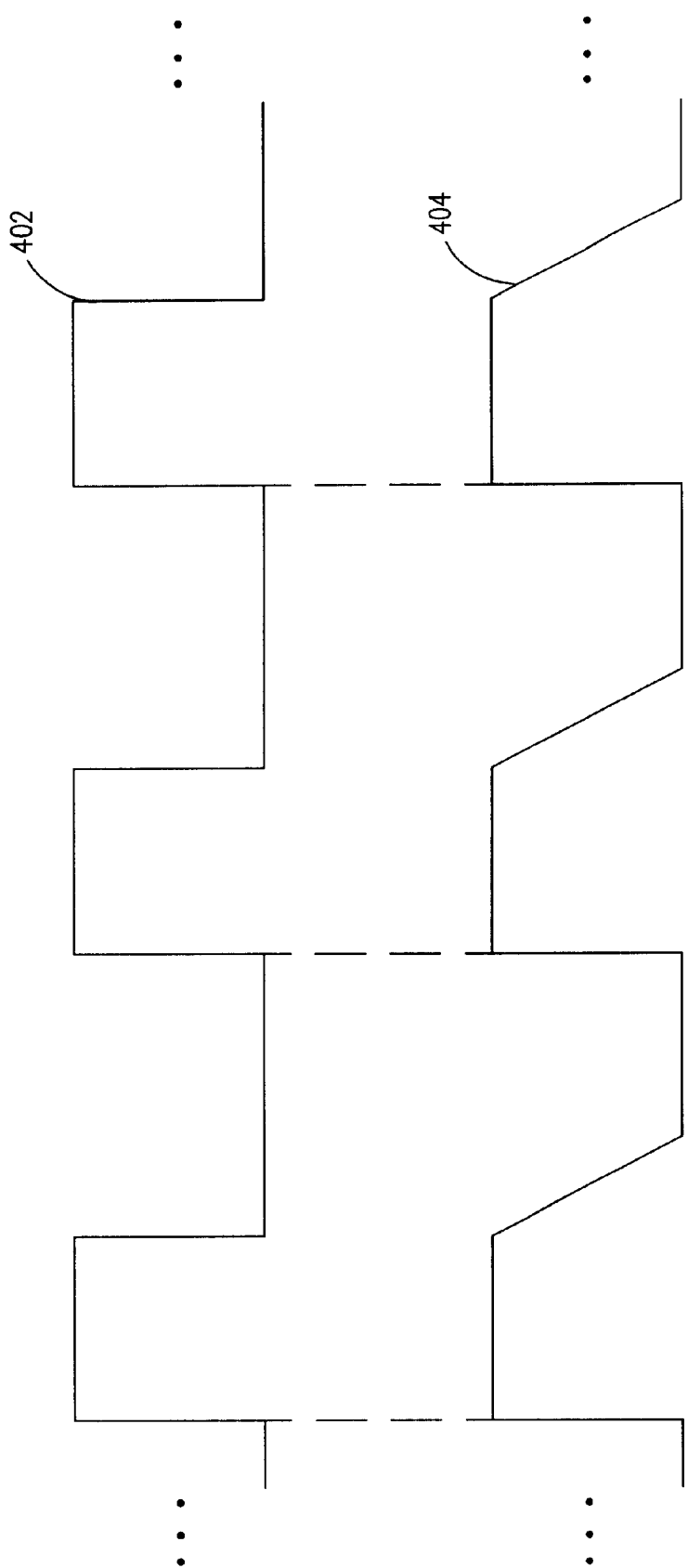
FIG. 4 illustrates the delay provided by the timing block of FIG. 3.

The delay provided by the current path 340 of the frequency control circuit 306 of the timing block 106A is illustrated by exemplary signals 402 and 404 in FIG. 4. The signal 402 represents the original signal from the output node 334 of the differential amplifier 304, i.e., the second amplified differential signal from the output node 334. The signal 404 represents the delayed signal on the output 124A of the timing block 106A. As shown in FIG. 4, the falling edges of the delayed signal 404 are more shallowly sloped, as compared to the sharp falling edges of the original signal 402, which is defined by the capacitance of the timing capacitor 344 and the pull-down current of the current source MOS transistor 338. The slope of the falling edges of the delayed signals 404 can be adjusted by changing these two factors.

Similar to the delay for the second amplified differential signal from the output node 334, the delay for the second amplified differential signal from the output node 332 of the differential amplifier 304 is determined by the pull-down cutoff of the emitter follower transistor 346 and the falling voltage slew-rate of the associated output node 352, which is defined by the capacitance of the timing capacitor 354 and the pull-down current of the current source MOS transistor 348. As a result, a delayed signal of the second amplified differential signal from the output node 332 of the differential amplifier 304 is generated at the output 126A of the timing block 106A.

The pull-down cutoffs of the emitter follower transistors 336 and 346 and the capacitances of the timing capacitors 344 and 354 are fixed. Thus, the delay provided by the frequency control circuit 306 of the timing block 106A is controlled by the pull-down currents of the current source MOS transistors 338 and 348, which are determined by the control current from the V-C converter 102. Since the control current is derived from the input control voltage, the control voltage is the exclusive factor that determines the delay provided by the timing block 106A. Furthermore, since the control current is provided to both of the timing blocks 106A and 106B, the input control voltage also determines the delay provided by the timing block 106B. Consequently, the frequency of the VCO 100 can be controlled by adjusting the input control voltage.

Figure 5:
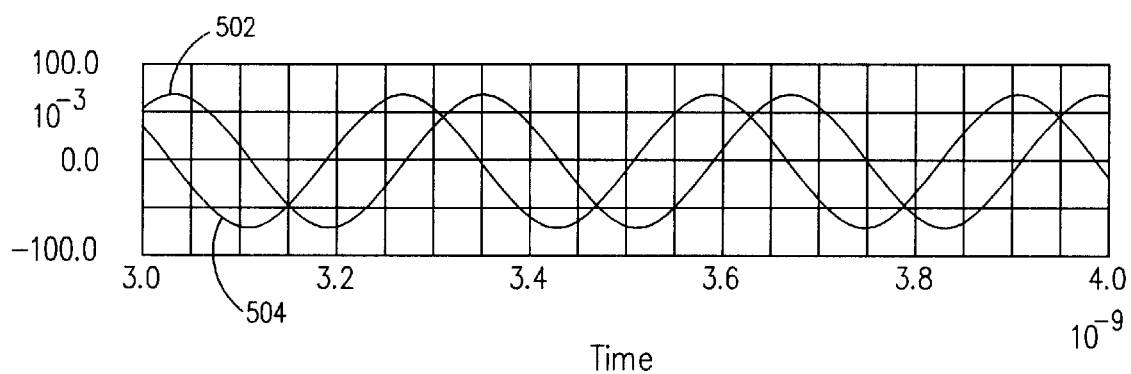
FIG. 5 illustrates the quadrature phase relationship of differential signals generated by the voltage controlled oscillator.
Figure 6:
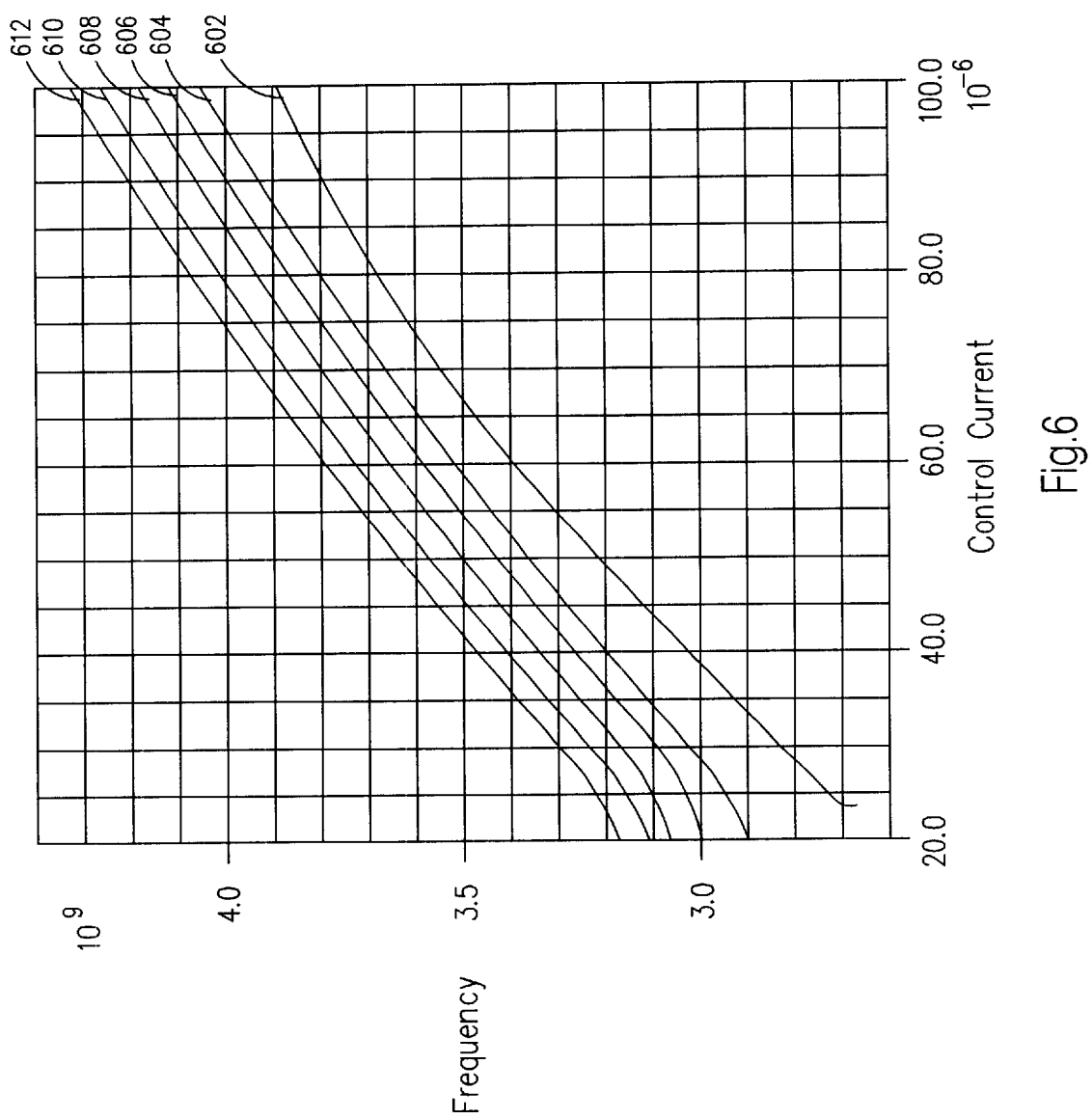
FIG. 6 illustrates the frequencies of differential signals generated by the voltage controlled oscillator for various supply voltages.
Figure 7:
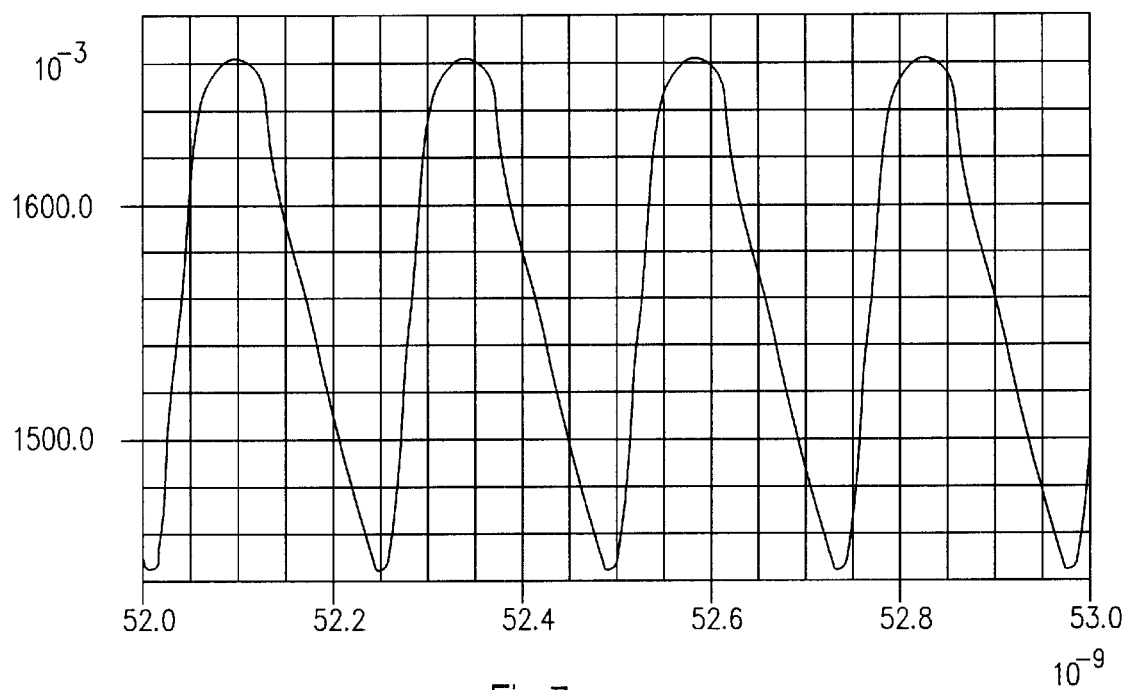
FIGS. 7 and 8 illustrate the differential signals generated by the voltage controlled oscillator.
Figure 8:
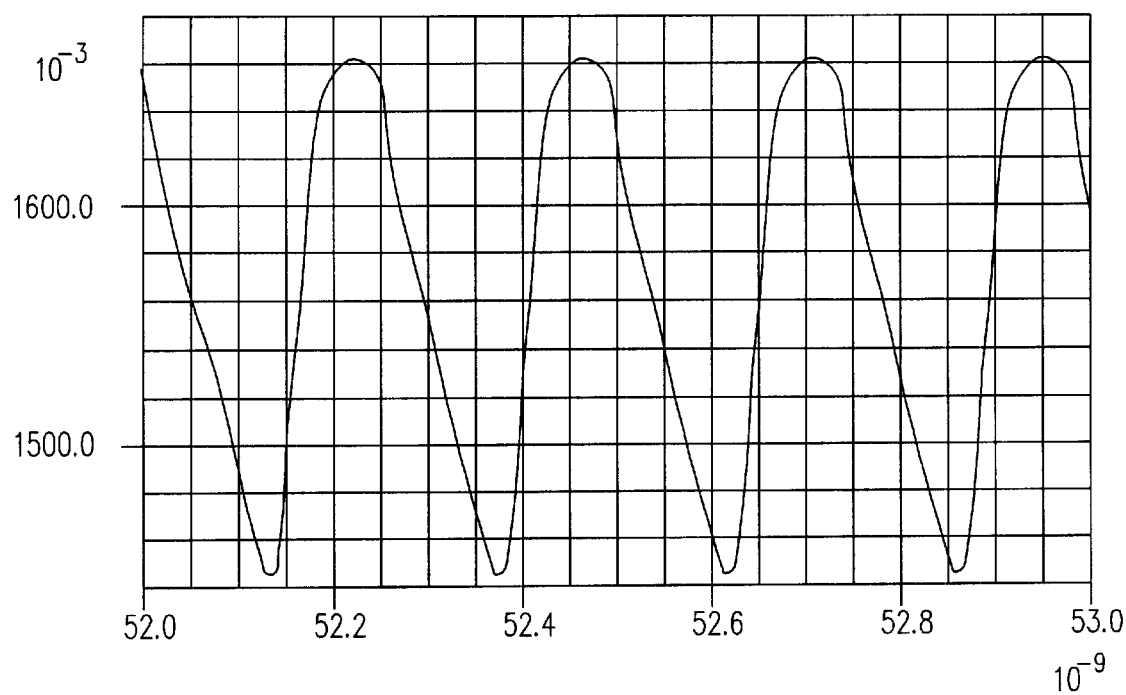

Computer simulations were performed to measure the performance of the VCO 100. These computer simulations revealed that the total supply current at 2.5 volts ranges from approximately 2.1 mA to 2.6 mA over the tuning range of 3.1 GHz to 4.3 GHz. Furthermore, the simulations show that the output waveforms at the outputs 124A, 126A, 124B and 126B of the timing blocks 106A and 106B have a quadrature phase relationship, which is useful in certain applications. The quadrature phase relationship is illustrated in FIG. 5. The signal 502 is the differential signal on the output 126B of the timing block 106B minus the differential signal on the output 124B, while the signal 504 is the differential signal on the output 126A of the timing block 106A minus the differential signal on the output 124A. The simulations also indicate that the VCO 100 can operate at a minimum of 1.8 volts under nominal conditions in a biCMOS process using the bipolar transistors as the signal path. In FIG. 6, the frequency of the VCO 100 is plotted with respect to the control current for various VDDs. The curves 602, 604, 606, 608, 610 and 612 in FIG. 6 correspond to a VDD range of 1.8 volts through 2.8 volts. The waveforms of the differential signals on the outputs 124B and 126B of the timing block 106B are shown in FIGS. 7 and 8, respectively. These waveforms illustrate the delay caused by the frequency control circuit of the timing block 106B, as described above in reference to FIG. 4.

In an alternative embodiment, the bipolar transistors 312, 314, 326, 328, 336 and 346 in the timing blocks 106A and 106B of the VCO 100 may be replaced with MOS transistors. Thus, in this embodiment, the VCO may be fabricated using CMOS fabrication process, which is less expensive than the biCMOS process. The use of MOS transistors in an advanced process for the signal path will likely further reduce the minimum supply voltage required by the VCO 100.

Furthermore, although the current mirror formed by the bias MOS transistor 202 of the bias circuit 104 shown in FIG. 1 and the current source transistors 338 and 348 of the timing blocks 106A and 106B has been described to provide a one-to-one current ratio due to the identical geometries of the transistors, the current mirror may be alternatively implemented to provide a current ratio other than a one-to-one current ratio. Such an implementation can be achieved by selectively changing the geometries of the transistors in the current mirror. Similarly, the current mirror formed by the bias MOS transistor 204 of the bias circuit 104 and the current source transistors 316 and 330 of the timing blocks 106A and 106B may be alternatively implemented to provide a current ratio other than a one-to-one current ratio. The use of current ratios other than a one-to-one current ratio may also apply to other components in the timing blocks 106A and 106B of the VCO as well.

Figure 9:
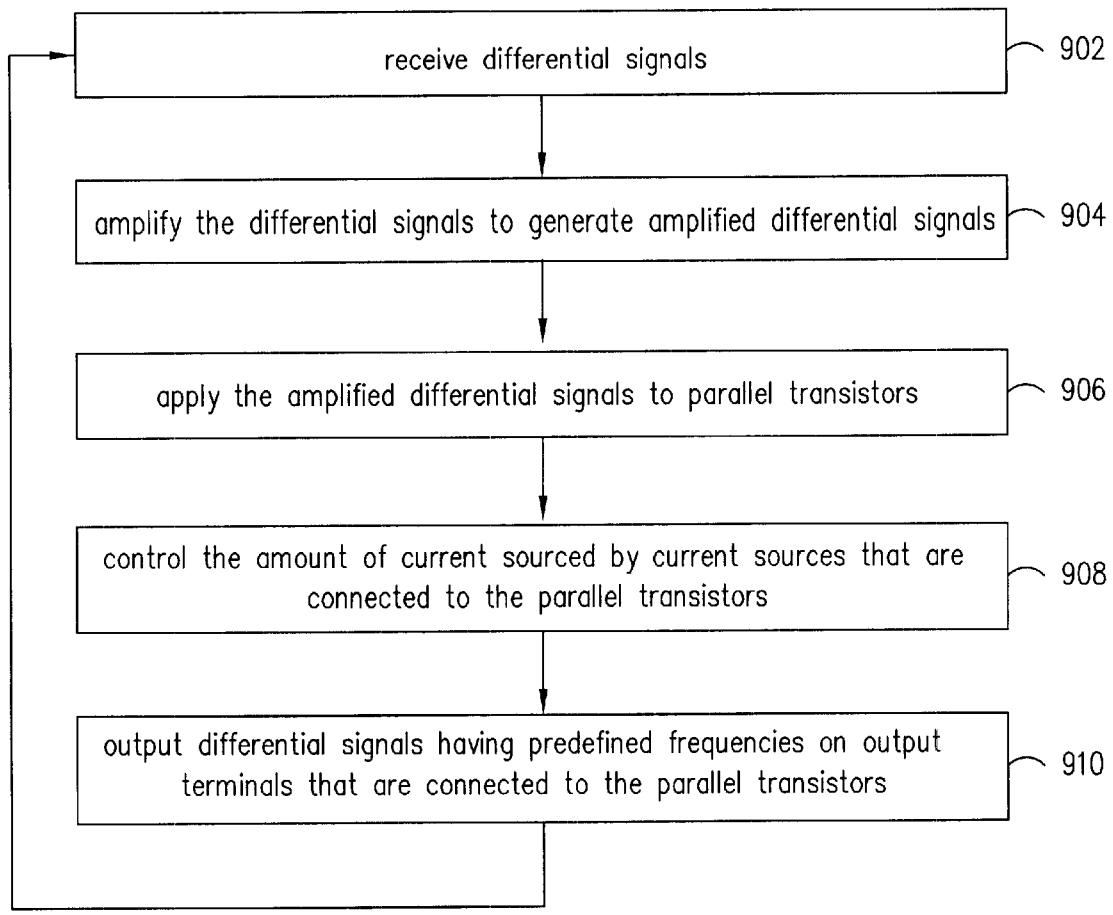
FIG. 9 is a process flow diagram of a method for generating oscillating signals having controllable frequencies in accordance with the present invention.

A method of generating oscillating signals having controllable frequencies in accordance with the present invention is described with reference to FIG. 9. At step 902, differential signals are received. Next, at step 904, the differential signals are amplified to generate amplified differential signals. The amplified differential signals are then applied to parallel transistors, at step 906. In one embodiment, the parallel transistors are emitter follower transistors. In another embodiment, the parallel transistors are MOS transistors. At step 908, the amounts of current sourced by current sources that are connected to the parallel transistors are controlled using an input voltage. Next, at step 910, differential signals having predefined frequencies are output on output terminals that are connected to the parallel transistors. Each of the output terminals includes a timing capacitor. Steps 901–910 are then repeated using different parallel transistors, current sources, output terminals and timing capacitors.

Although a specific embodiment of the invention has been described and illustrated, the invention is not to be limited to the specific forms or arrangements of parts so described and illustrated. The scope of the invention is to be defined by the claims appended hereto and their equivalents.

What is claimed is:

1. A timing block of a frequency controllable oscillator comprising:
   a differential voltage gain circuit configured to output amplified differential signals in response to input differential signals; and
   a frequency control circuit coupled to the differential voltage gain circuit, the frequency control circuit including a first transistor and a first current source on a first current path and a second transistor and a second current source on a second current path, the first current path having a first output terminal connected to a first capacitor, the second current path having a second output terminal connected to a second capacitor, the first transistor and the second transistor being controlled by the amplified differential signals from the differential voltage gain circuit, the first current source and the second current source being controlled by an input voltage to source defined amounts of current, the defined amounts of current at least partially defining frequencies of final differential signals on the first and second output terminals.

2. The timing block of claim 1 wherein the first and second current paths of the frequency control circuit are connected in parallel between a supply voltage and a low voltage terminal such that the first and second transistors are connected to the supply voltage and the first and second current sources are connected to the low voltage terminal.

3. The timing block of claim 2 wherein the first and second transistors of the frequency control circuit are bipolar transistors.

4. The timing block of claim 2 wherein the first and second transistors of the frequency control circuit are metal oxide semiconductor transistors.

5. The timing block of claim 2 wherein each of the first and second current sources includes a single metal oxide semiconductor transistor.

6. The timing block of claim 1 wherein the differential voltage gain circuit includes a differential amplifier having differential transistors that are connected to a common current source.

7. The timing block of claim 6 wherein each of the differential transistors of the differential amplifier is connected to a resistor, which is connected to a supply voltage.

8. The timing block of claim 6 wherein the differential voltage gain circuit includes a second differential amplifier having second differential transistors that are connected to a second common current source.

9. A frequency controllable oscillator comprising:
   a plurality of timing blocks connected in a circular signal path configuration, each timing block comprising:
      a differential voltage gain circuit configured to output amplified differential signals in response to input differential signals; and
      a frequency control circuit coupled to the differential voltage gain circuit, the frequency control circuit including a first transistor and a first current source on a first current path and a second transistor and a second current source on a second current path, the first current path having a first output terminal connected to a first capacitor, the second current path having a second output terminal connected to a second capacitor, the first transistor and the second transistor being controlled by the amplified differential signals from the differential voltage gain circuit, the first current source and the second current source being controlled by an input voltage to source defined amounts of current, the defined amounts of current at least partially defining frequencies of output differential signals on the first and second output terminals.

10. The frequency controllable oscillator of claim 9 wherein the plurality of timing blocks includes a first timing block and a second timing block, each of the first and second timing blocks having input terminals and output terminals, the first and second timing blocks being configured such that the output terminals of the first timing block are connected to the input terminals of the second timing block and the output terminals of the second timing block are connected to the input terminals of the first timing block.

11. The frequency controllable oscillator of claim 10 wherein the input terminals and the output terminals of the first and second timing blocks are connected such that output differential signals from the first timing block are inversely received by the second timing block.

12. The frequency controllable oscillator of claim 9 wherein the first and second current paths are connected in parallel between a supply voltage and a low voltage terminal such that the first and second transistors are connected to the supply voltage and the first and second current sources are connected to the low voltage terminal.

13. The frequency controllable oscillator of claim 12 wherein the first and second transistors of the frequency control circuit are bipolar transistors.

14. The frequency controllable oscillator of claim 12 wherein the first and second transistors of the frequency control circuit are metal oxide semiconductor transistors.

15. The frequency controllable oscillator of claim 12 wherein each of the first and second current sources includes a single metal oxide semiconductor transistor.

16. The frequency controllable oscillator of claim 9 wherein the differential voltage gain circuit includes a differential amplifier having differential transistors that are connected to a common current source.

17. The frequency controllable oscillator of claim 16 wherein each of the differential transistors of the differential amplifier is connected to a resistor, which is connected to a supply voltage.

18. The frequency controllable oscillator of claim 16 wherein the differential voltage gain circuit includes a second differential amplifier having second differential transistors that are connected to a second common current source.

19. The frequency controllable oscillator of claim 9 further comprising a bias transistor connected to the first and second transistors of each timing block, the input voltage being received by the plurality of timing blocks through the bias transistor.

20. A method of generating oscillating signals having controllable frequencies comprising:
receiving first differential signals;
amplifying the first differential signals to generate amplified first differential signals;
applying the amplified first differential signal to parallel transistors;
controlling amounts of current sourced by current sources that are connected to the parallel transistors using an input voltage; and
outputting second differential signals having predefined frequencies on output terminals that are connected to the parallel transistors, the output terminals further being connected to capacitors, the predefined frequencies of the second differential signals being at least partially determined by the amounts of current sourced by the current sources and the capacitances of the capacitors.

21. The method of claim 20 further comprising:
receiving the second differential signals;
amplifying the second differential signals to generate amplified second differential signals;
applying the amplified second differential signal to second parallel transistors;
controlling amounts of current sourced by second current sources that are connected to the second parallel transistors using the input voltage; and
outputting the first differential signals having the predefined frequencies on second output terminals that are connected to the second parallel transistors, the second output terminals further being connected to second capacitors.

22. The method of claim 20 wherein the first differential signals and the second differential signals have a quadrature phase relationship.

23. The method of claim 20 wherein the step of controlling the amounts of current sourced by the current sources includes supplying the input voltage to parallel current control transistors that function as the current sources.

24. The method of claim 20 wherein the step of amplifying the first differential signals includes amplifying the first differential signals in two stages using multiple differential amplifiers.

25. The method of claim 20 wherein the parallel transistors are bipolar transistors.

26. The method of claim 20 wherein the parallel transistors are metal oxide semiconductor transistors.

* * * * *